(12) United States Patent
Wu

(10) Patent No.: US 7,397,133 B2
(45) Date of Patent: Jul. 8, 2008

(54) SUBMOUNT FOR DIODE WITH SINGLE BOTTOM ELECTRODE

(76) Inventor: Jiahn-Chang Wu, No. 15, Lane 13, Alley 439, Her-Chiang Street, Chutung, Hsin-Chu (TW) 310

( * ) Notice: Subject to any disclaimer, the term of this patent is extended or adjusted under 35 U.S.C. 154(b) by 0 days.

(21) Appl. No.: 10/847,225

(22) Filed: May 18, 2004

(65) Prior Publication Data

US 2005/0258445 A1 Nov. 24, 2005

(51) Int. Cl.
*H01L 23/48* (2006.01)
*H01L 23/52* (2006.01)
*H01L 29/40* (2006.01)

(52) U.S. Cl. .............. 257/778; 257/781; 257/E33.006

(58) Field of Classification Search ............ 257/81, 257/82, 84, 98–100, 778, 781, E33.006
See application file for complete search history.

(56) References Cited

U.S. PATENT DOCUMENTS

| 6,833,566 B2 * | 12/2004 | Suehiro et al. ............ 257/99 |
| 2005/0051859 A1 * | 3/2005 | Hoffman .................... 257/434 |

\* cited by examiner

*Primary Examiner*—Thien F Tran
(74) *Attorney, Agent, or Firm*—H. C. Lin, Patent Agent

(57) ABSTRACT

A submount is used to mount a diode between two metal areas on the upper surface of a substrate. One of the areas is connected to a metal plate at the lower surface of the substrate through a via. The submount is clamped between two metal sheets. The top metal sheet has a through-hole for anchoring and self-aligning the diode. The electrodes of the diode are each coupled to one of the clamping metal sheets. Clamping metals provide pressure contact without soldering to the contact. But soldering can be alternatively used to enhance product reliability. Either the top metal sheet or the bottom metal sheet can be fully or selectively coating of solder for batch soldering at the contact point upon heating. The large metal plates and the large metal clamping sheets provide good heat sink and speedy soldering.

3 Claims, 26 Drawing Sheets

SUBMOUNT FOR DIODE WITH SINGLE BOTTOM ELECTRODE

BACKGROUND OF THE INVENTION

1. Field of the Invention

This invention relates to diode package, particularly to light emitting diodes or face emission laser diode.

2. Brief Description of Related Art

U.S. Pat. No. 6,642,618B2 disclosed a light emitting diode (LED) 102. The LED has two bottom electrodes mounted on a submount 108 through solder bumps 103. The submount has two metallic sections 109 contacting to two respective electrodes. The submount 108 has two through holes 111 lined with metallic lining for coupling the two top metallic sections 109 to the bottom of the submount as extensions 110. Subsequently, the submount 108 can be placed on a printed circuit board 101a, which has two metal pads 101b for coupling with the extensions 110. The structure forms a diode unit or a matrix array.

The prior art used a printed circuit board 101a as a motherboard, and the submount 108 is connected to the motherboard 101a by means of soldering. In recent years, a bottleneck in the application of LEDs is the heat dissipation problem. The glass fiber circuit board does not have good heat dissipating property. A ceramic board has better heat dissipation property, but is more costly and requires time-consuming soldering to mount the submount to the motherboard.

SUMMARY OF THE INVENTION

An object of the present invention is to provide a submount for a diode that has good heat sinking property. Another object of the invention is to eliminate soldering the submount to the motherboard. Still another object of the invention is to self-align the diode in a package.

These objects are achieved by mounting the diode on a substrate with two coplanar metal areas on the top surface, each connected to respective electrodes of the LED. One of the coplanar areas is connected through a via to the bottom surface of the submount. The submount is clamped between a top metal sheet and a bottom metal sheet. The top metal sheet of the clamp has a through-hole to anchor the diode for self-alignment. The large coplanar areas on the submount and the clamp between two metallic plates to overcome the poor heat sinking and slow soldering drawbacks. The clamping with two metal sheets provides pressure contact for electrical coupling and eliminates traditional soldering process. However, soldering process can be added for enhancing product reliability. The alternative soldering process is speeded up by pre-painting some soldering material at the contacting regions of the clamping metal sheets and followed with a subsequent overall heating to make the contacts. With improved heat sinking and speedup of soldering processing, the reliability of the LED package is improved.

Two metal surfaces are formed on the substrate 22, one metal surface on top and the other one on bottom to form the extensions of the electrodes of the LED, so that one extension faces upward and another extension faces downward facilitate the metal clamping. The clamping eliminates soldering to the diode electrodes to the clamping metal sheets.

The upper sheet of the clamp has at least one through-hole slightly larger than the diode chip. The chip is mated with the through-hole to provide accurate positioning with respect to the package. This accurate positioning is especially important either in single package or matrix LED array especially in the field of optical communication, alignment is usually with reference to the outline of a package, therefore, the relative accuracy of a light emitting diode with reference to its package peripherals. In a matrix application, the upper metal clamping plate is provided with a large number of through-holes and each inserted with an LED chip to form an array

DETAILED DESCRIPTION OF THE INVENTION

Figure 1:
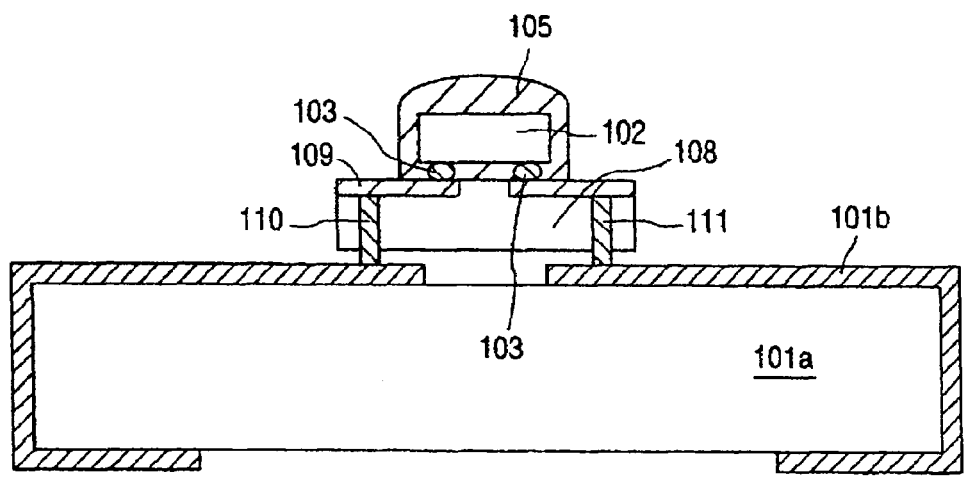
FIG. 1 shows a prior art submount for a light emitting diode soldered to a motherboard.
Figure 2:
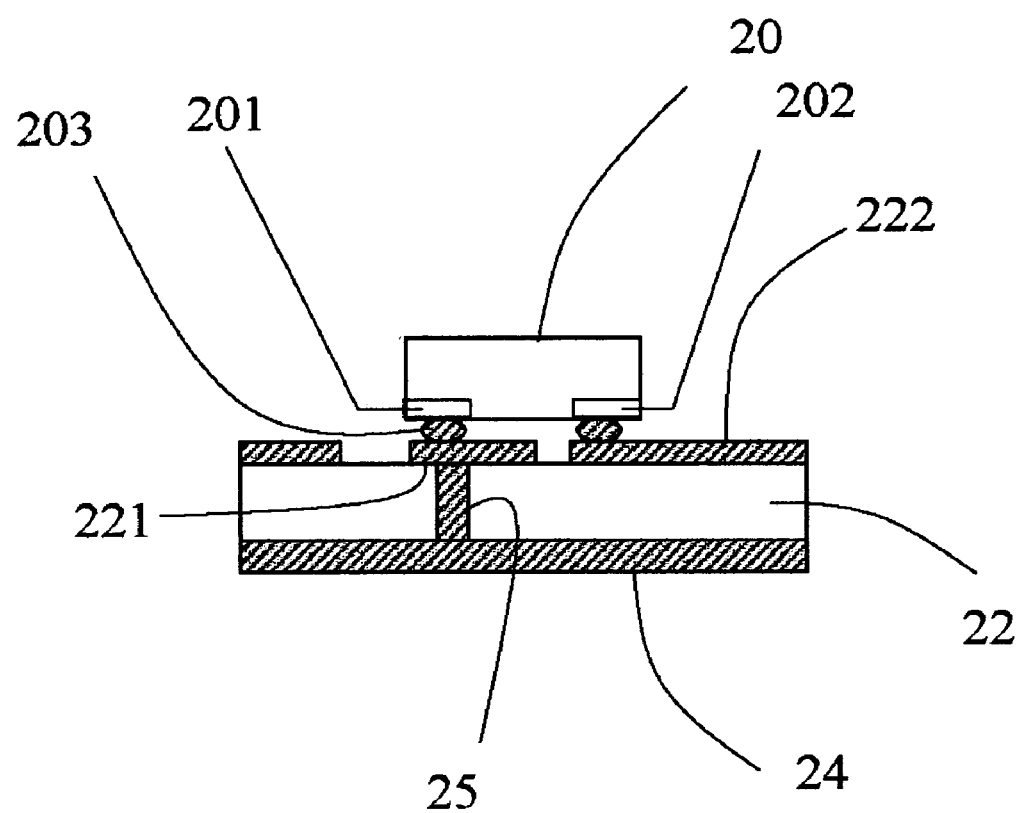
FIG. 2 shows the first embodiment of the submount of the present invention.

FIG. 2 shows the first embodiment of the submount for holding a light emitting diode (LED) chip based on the present invention. The LED chip 20 having a first electrode 201 and a second electrode 202 straddles between two metallic printed-circuit areas 221, 222 each soldered to the two electrodes respectively through solder bumps 203. The two metal areas are placed on the upper surface of a substrate 22. A vertical metallic conduit 25 in the substrate 22 connects the metal area 221 to a metal plate 24 beneath the lower surface of the substrate 22, so that the two extension metals appear one on the upper surface of the substrate 22 and the other one on the bottom of the substrate 22.

Figure 3:
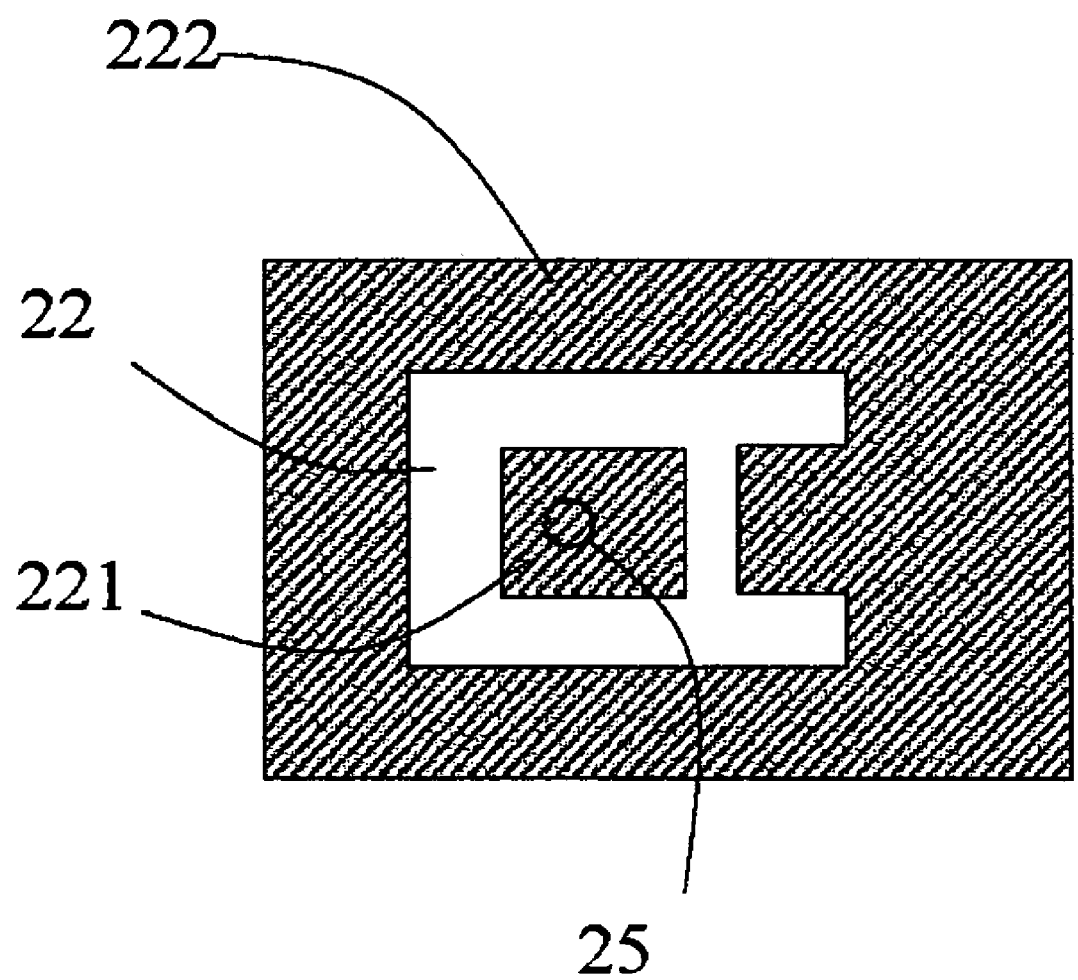
FIG. 3 shows the top view of the submount of FIG. 2.

FIG. 3 shows the top view of the submount in FIG. 2 with the first metallic area 221 and second metallic plate 222. The first metallic area 221 has a metal conduit 25, which extends to the metal layer 24 beneath the substrate 22.

Figure 4:
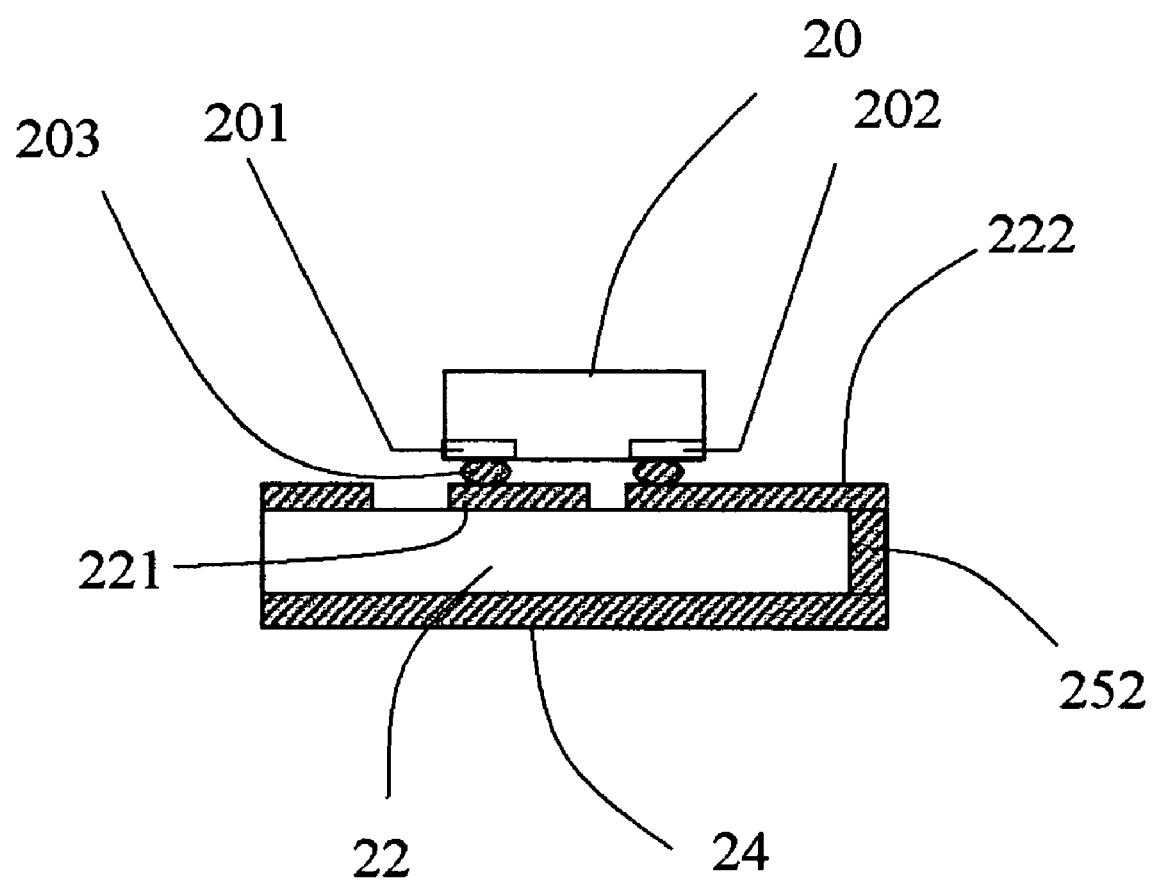
FIG. 4 shows the second embodiment of the submount of the present invention.

FIG. 4 shows the second embodiment of the present invention. Instead of the metal through-hole in FIG. 3, the metal conduct 252 is placed at the end of the substrate 22. The LED diode 20 has two bottom electrodes 201 and 202, each contacting the two metal areas 221 and 222 respectively. The lower metal plate 24 serves as one terminal for the diode 20.

Figure 5:
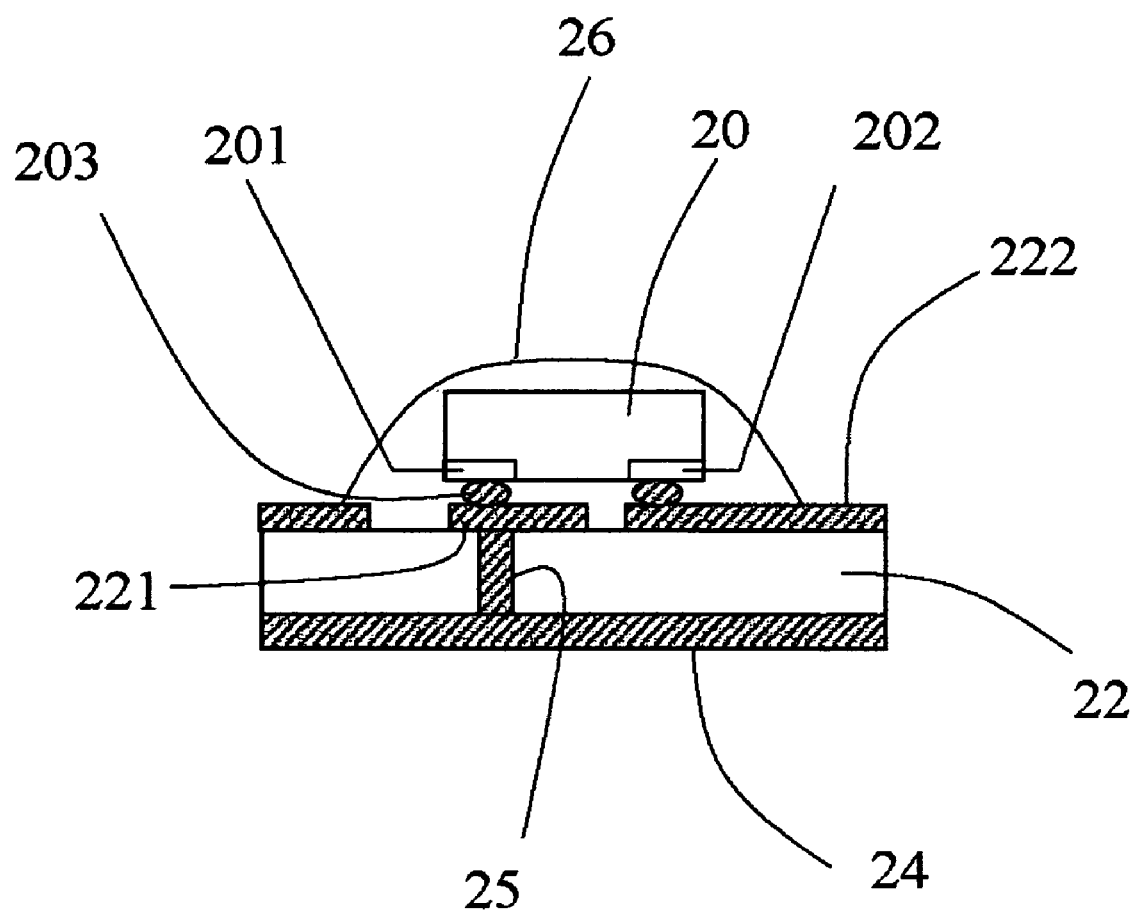
FIG. 5 shows the third embodiment of the submount of the present invention.

FIG. 5 shows the third embodiment of the present invention. In addition to the structure shown in FIG. 4, a coating of a protective glue 26 is used to seal over the chip 20 to improve the reliability.

Figure 6:
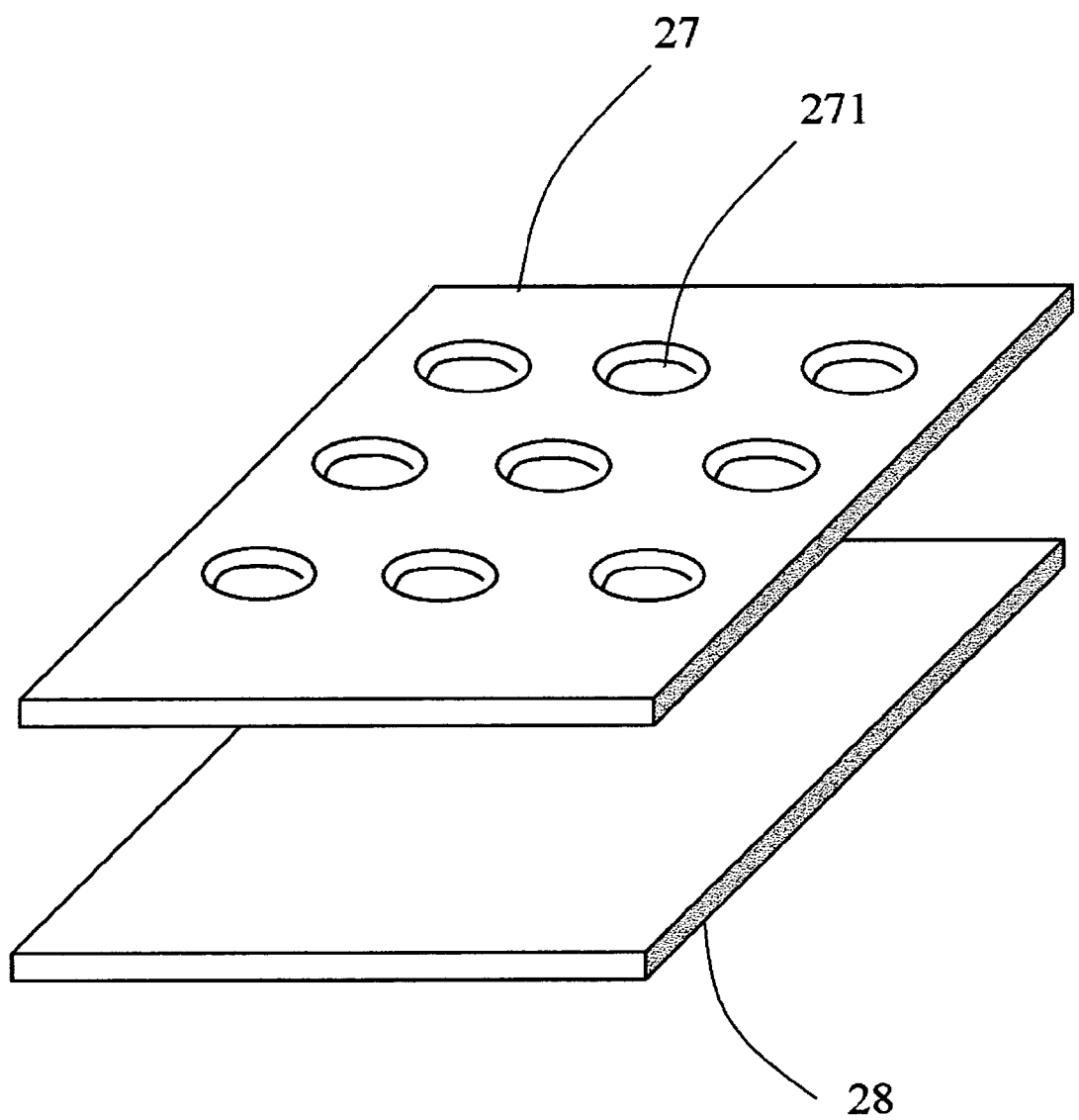
FIG. 6 shows a clamp for holding an array of submounts.
Figure 7:
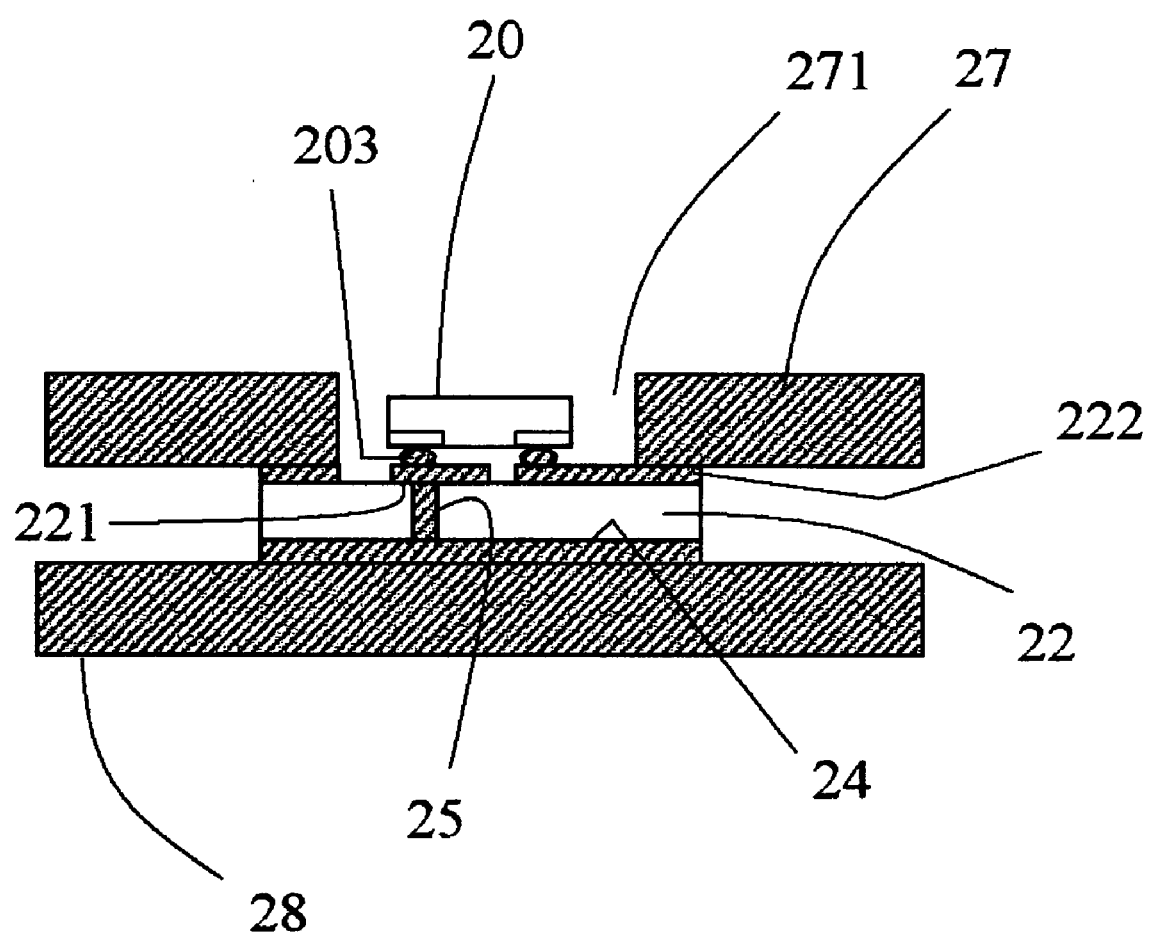
FIG. 7 shows the fourth embodiment of the submounts for housing in the clamp in FIG. 6.

FIG. 6 and FIG. 7 show the fourth embodiment of the present invention. The top metal sheet 27 and a bottom metal sheet 28 is used to clamp the substrate 22. The top metal sheet 27 has at least a through hole 271 to anchor the LED chip 20 mounted on the substrate 22. The bottom metal sheet 28 is placed below the substrate 22 to contact the lower metal plate 24 of the submount. With this anchoring, the chip 20 is self-aligned with reference to the peripheral of the package.

Figure 8:
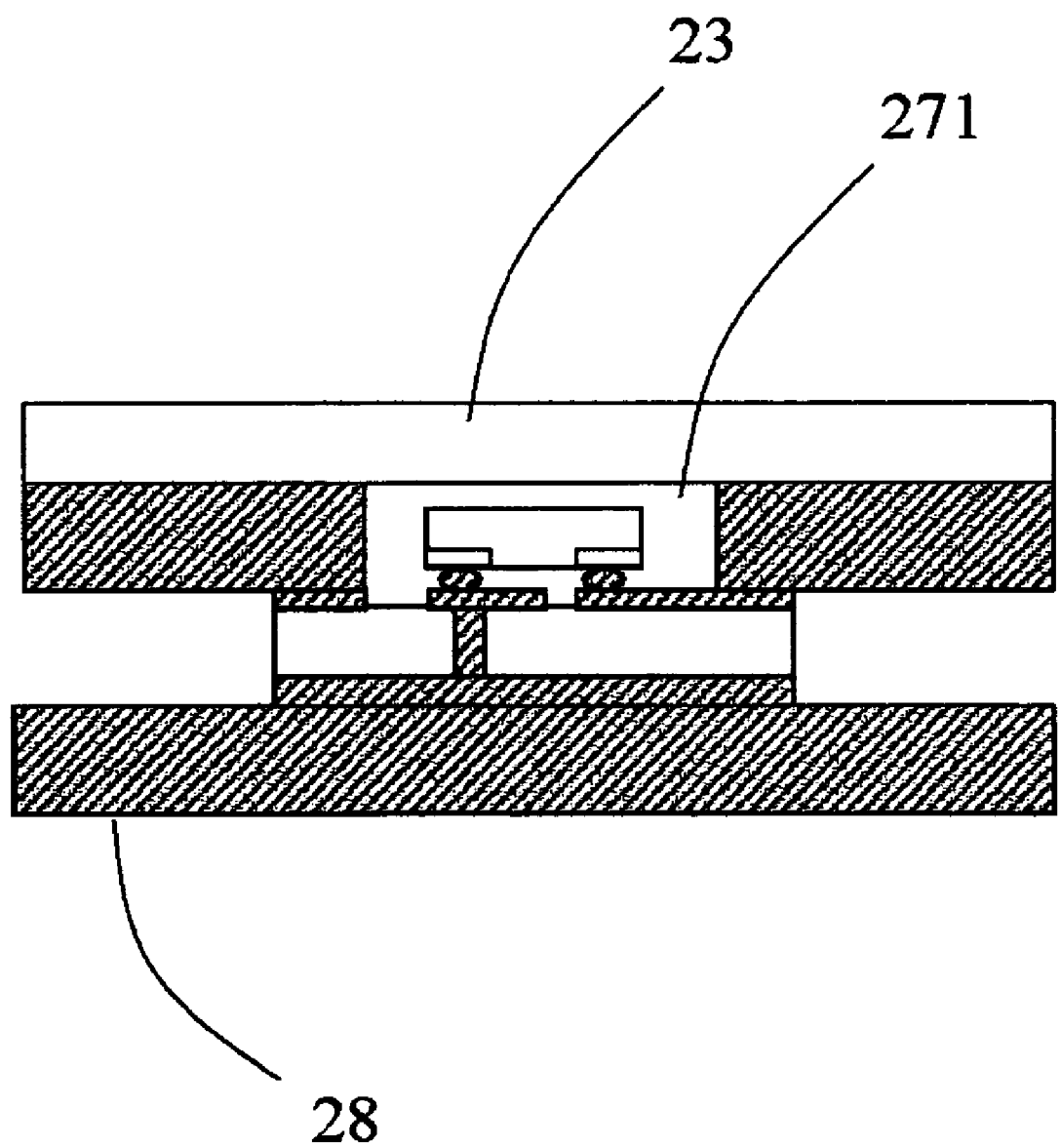
FIG. 8 shows the fifth embodiment of present invention with a window on top of the clamp in FIG. 7.

FIG. 8 shows the fifth embodiment of the present invention. In addition to the structure shown in FIG. 7, the thorough-hole 271 in the top metal sheet is covered with transparent material 23 to improve the reliability.

Figure 9:
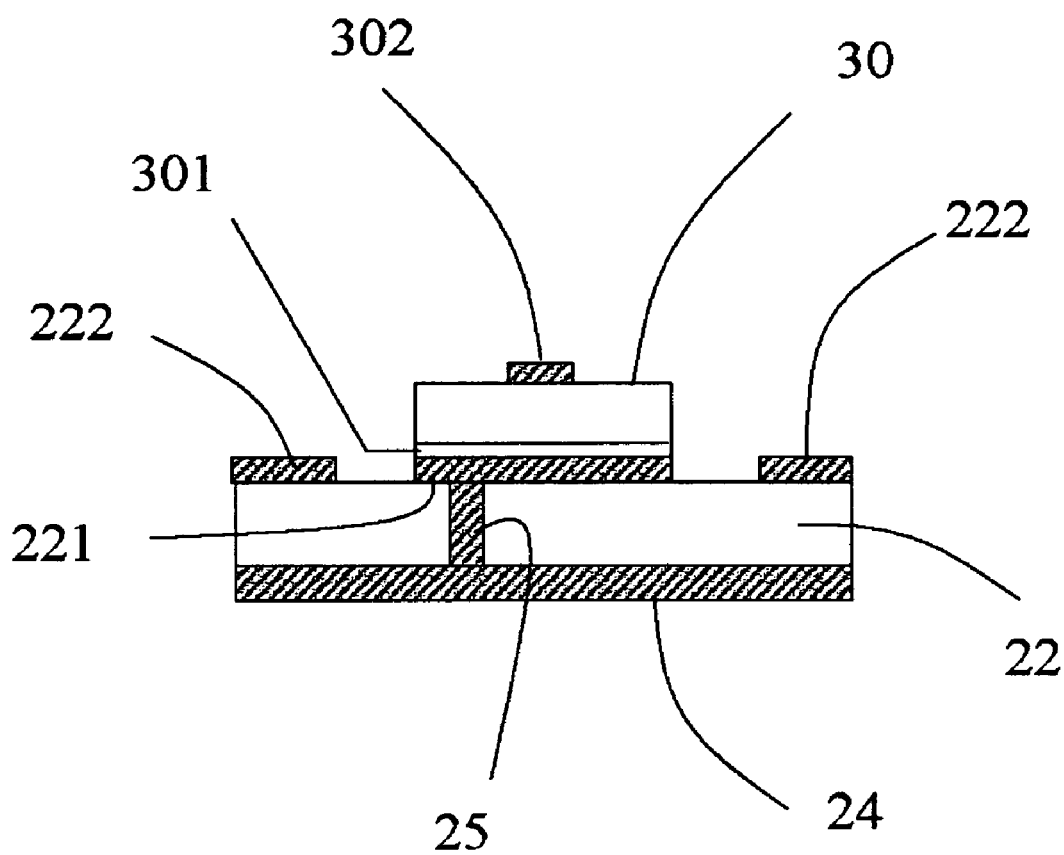
FIG. 9 shows the sixth embodiment of the present invention for a diode with a top electrode and a bottom electrode.

FIG. 9 shows the sixth embodiment of the present invention. The structure is similar to that shown in FIG. 2 except that the LED chip 30 has a top electrode 302 and a bottom electrode 301. The submount has at least printed circuit area 221 electrically coupled to the bottom electrode 301.

Figure 10:
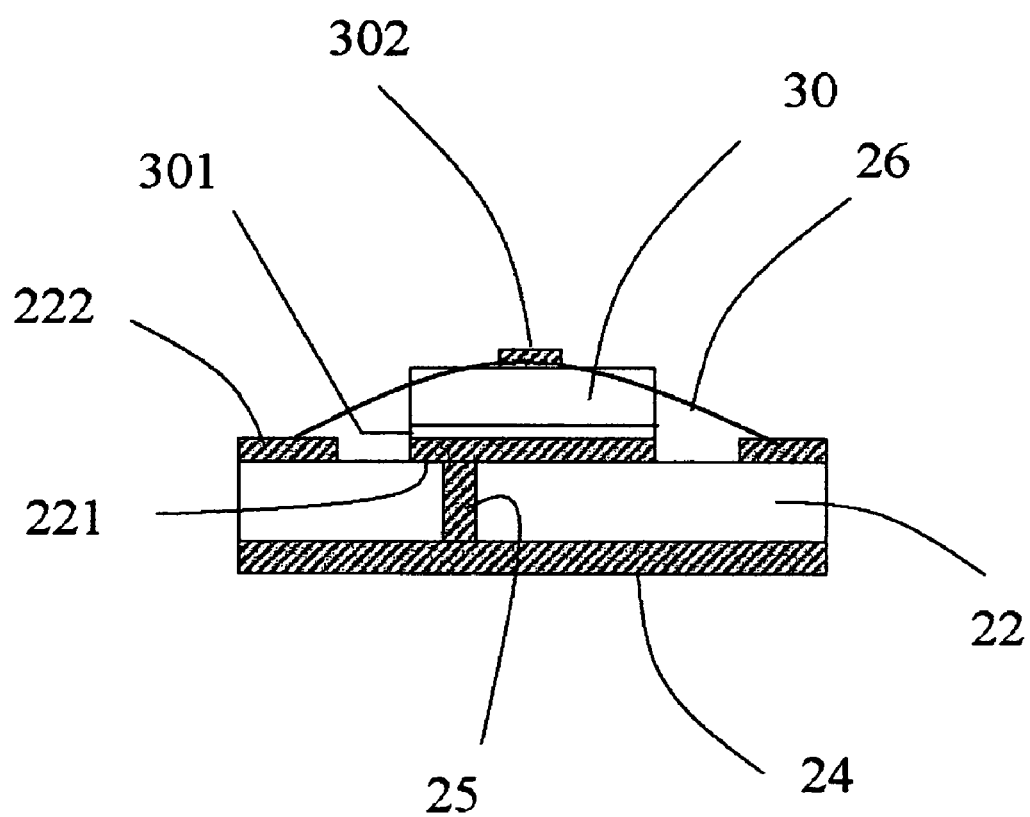
FIG. 10 shows the seventh embodiment of the present invention having glue sealing the structure in FIG. 9.

FIG. 10 shows the seventh embodiment of the present invention. In addition to the structure shown in FIG. 9, a coating of protective glue 26 is used to seal at least the edges of the chip 30 except the top electrode 302, which is wire-bonded.

Figure 11:
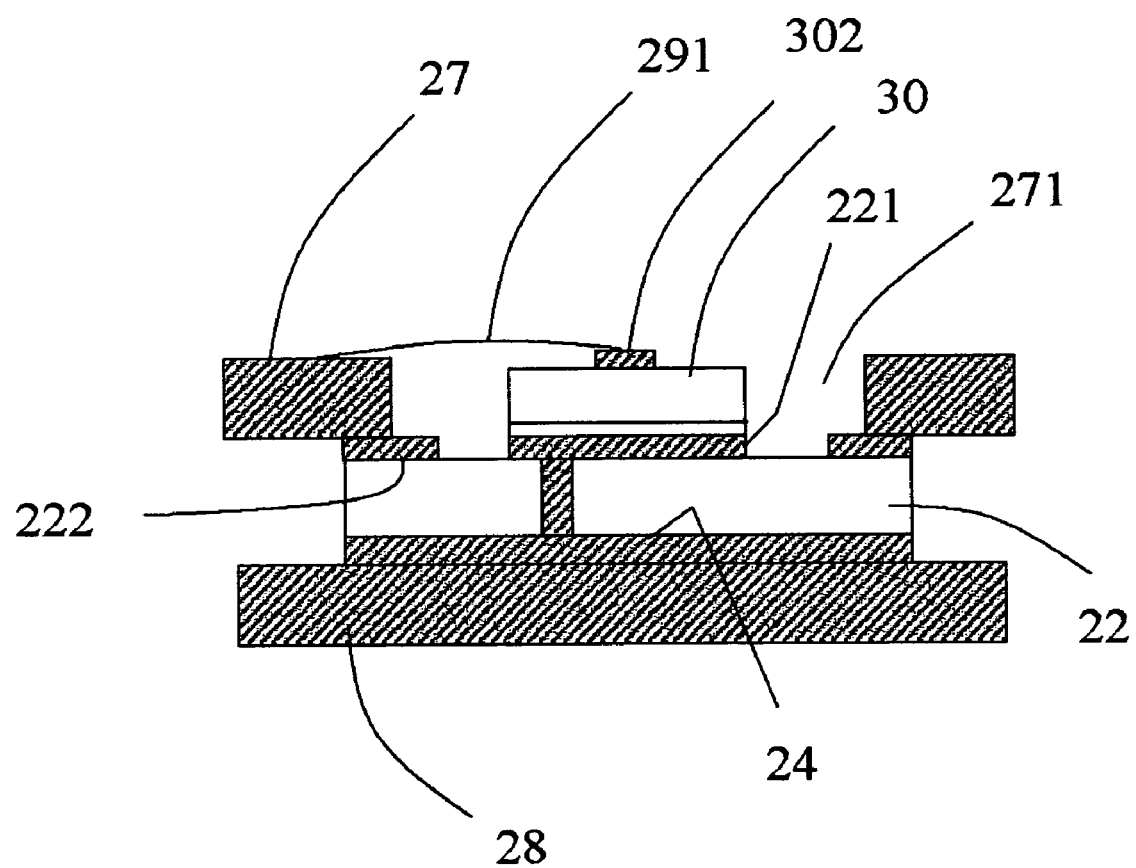
FIG. 11 shows the eighth embodiment of the present invention with a clamp for the structure shown in FIG. 9.

FIG. 11 shows the eighth embodiment of the present invention. The submount shown in FIG. 9 is clamped by a top metal sheet 27 and a bottom metal sheet 28. The top metal sheet has at least one through-hole 271 to anchor the LED chip 30 and to couple to the bottom electrode of the chip. A bonding wire is used to connected the top electrode 302 of the chip to the top metal sheet 27.

Figure 12:
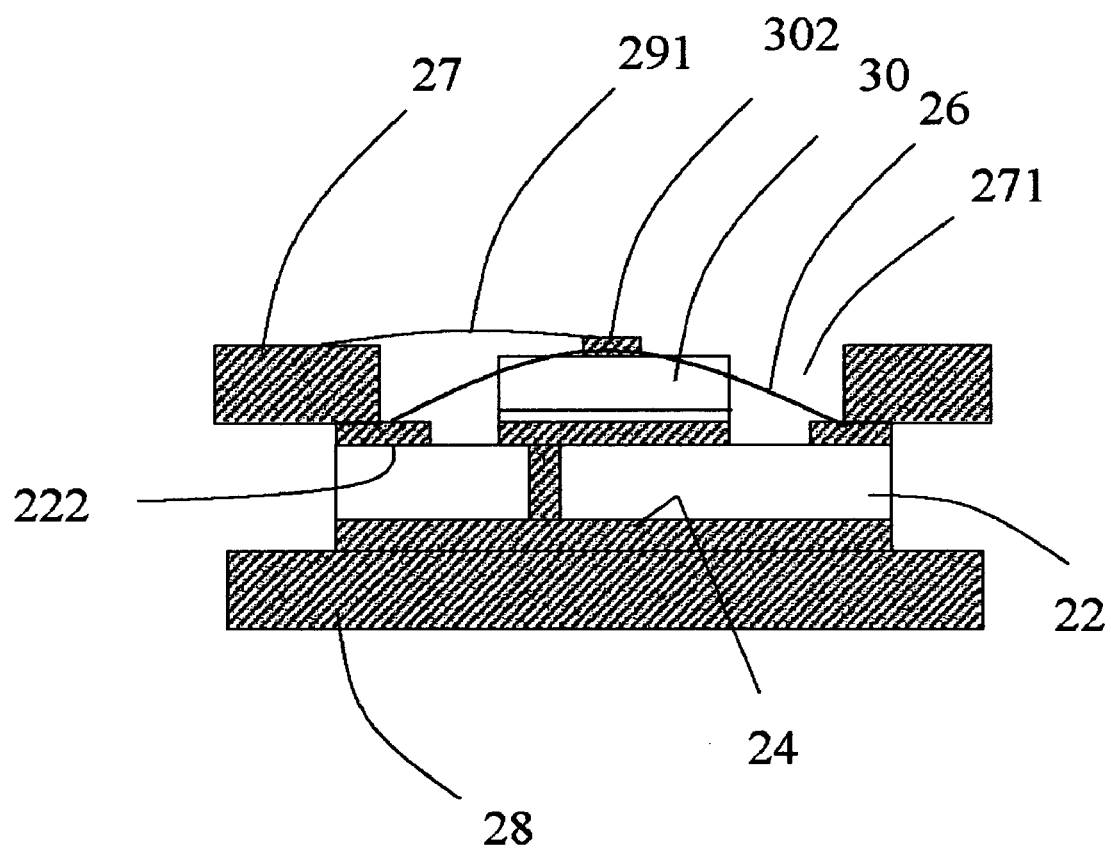
FIG. 12 shows the ninth embodiment of the present invention with sealing glue for the structure in FIG. 11.

FIG. 12 shows the ninth embodiment of the present invention. In addition to the clamped structure shown in FIG. 11, a protective glue 26 can be used to seal at least the edges of the diode chip 30 except the top surface which must be exposed for wire bonding but can be sealed after bonding.

Figure 13:
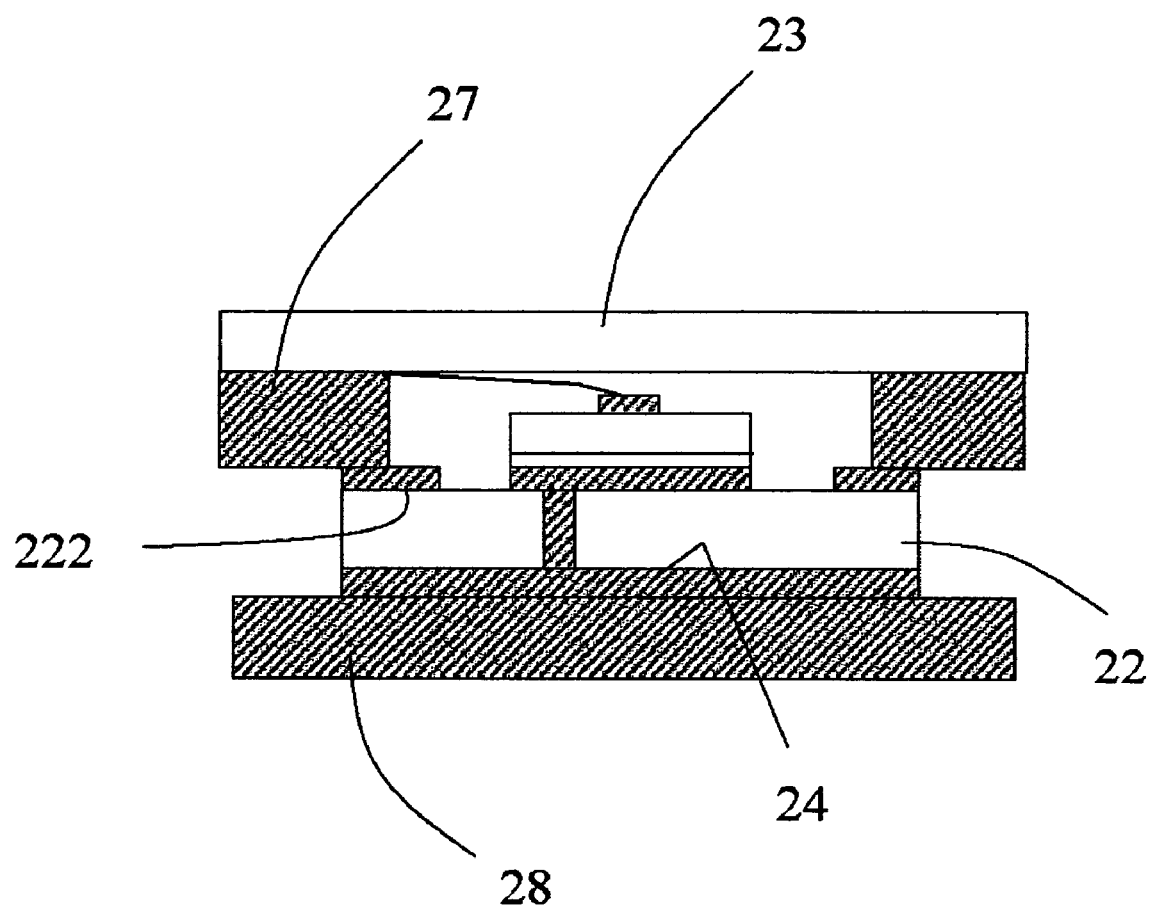
FIG. 13 shows the tenth embodiment of the present invention with a transparent window for the structure in FIG. 12.

FIG. 13 shows the tenth embodiment of the present invention. In addition to the structure in FIG. 12, a transparent material 23 is used to cover the top of the through hole.

Figure 14:
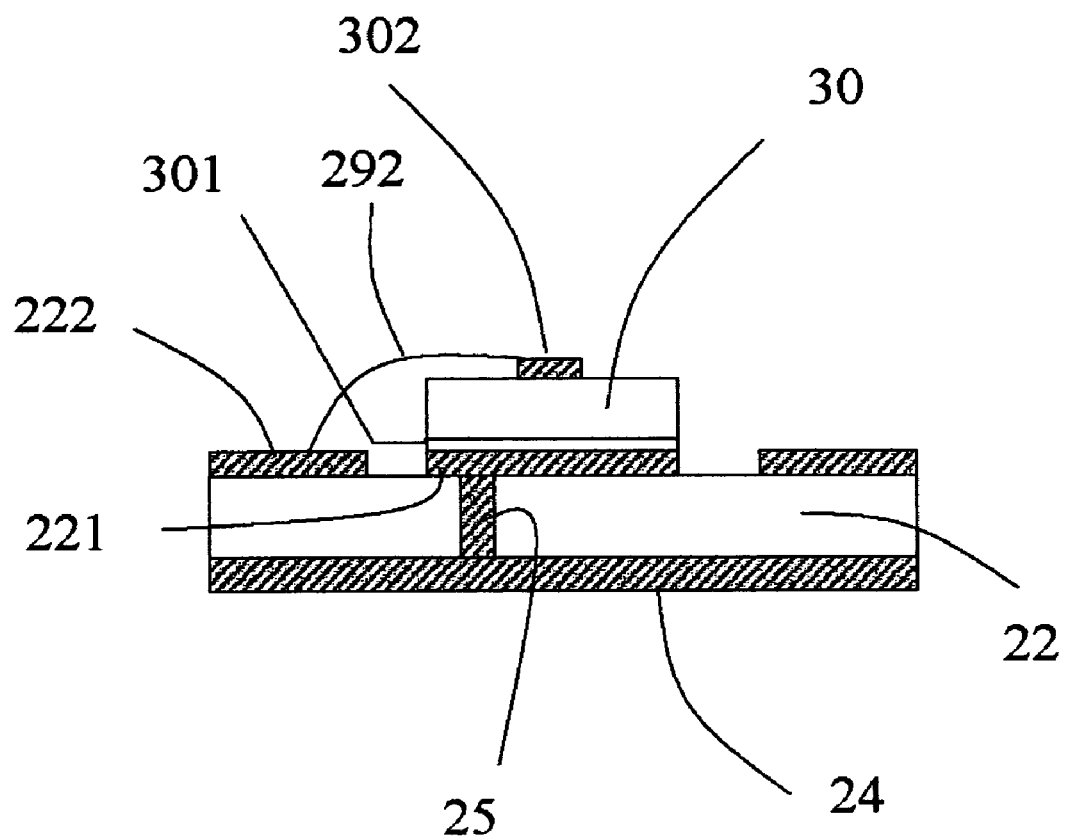
FIG. 14 shows the eleventh embodiment of the present invention with wire-bonding for the structure in FIG. 9.

FIG. 14 shows the eleventh embodiment of the present invention. In the submount shown in FIG. 9, the metal printed-circuit area 222 is wire-bonded to the electrode 302 of the diode chip 30.

Figure 15:
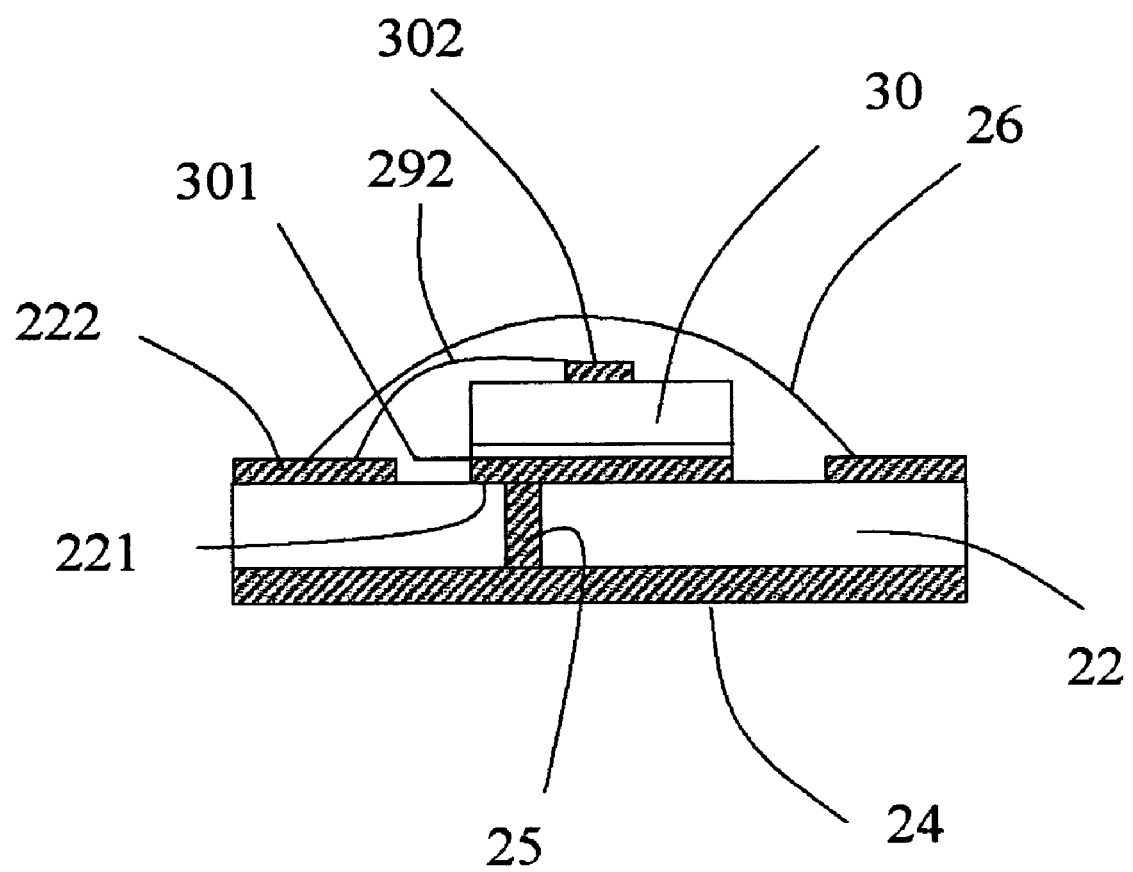
FIG. 15 show the twelfth embodiment of the present invention with protective glue for the structure in FIG. 14.

FIG. 15 shows the twelfth embodiment of the present invention. In addition to the structure shown In FIG. 14, a protective glue 26 is used to seal the diode chip 30, the top electrode 302 and the bonding wire 292.

Figure 16:
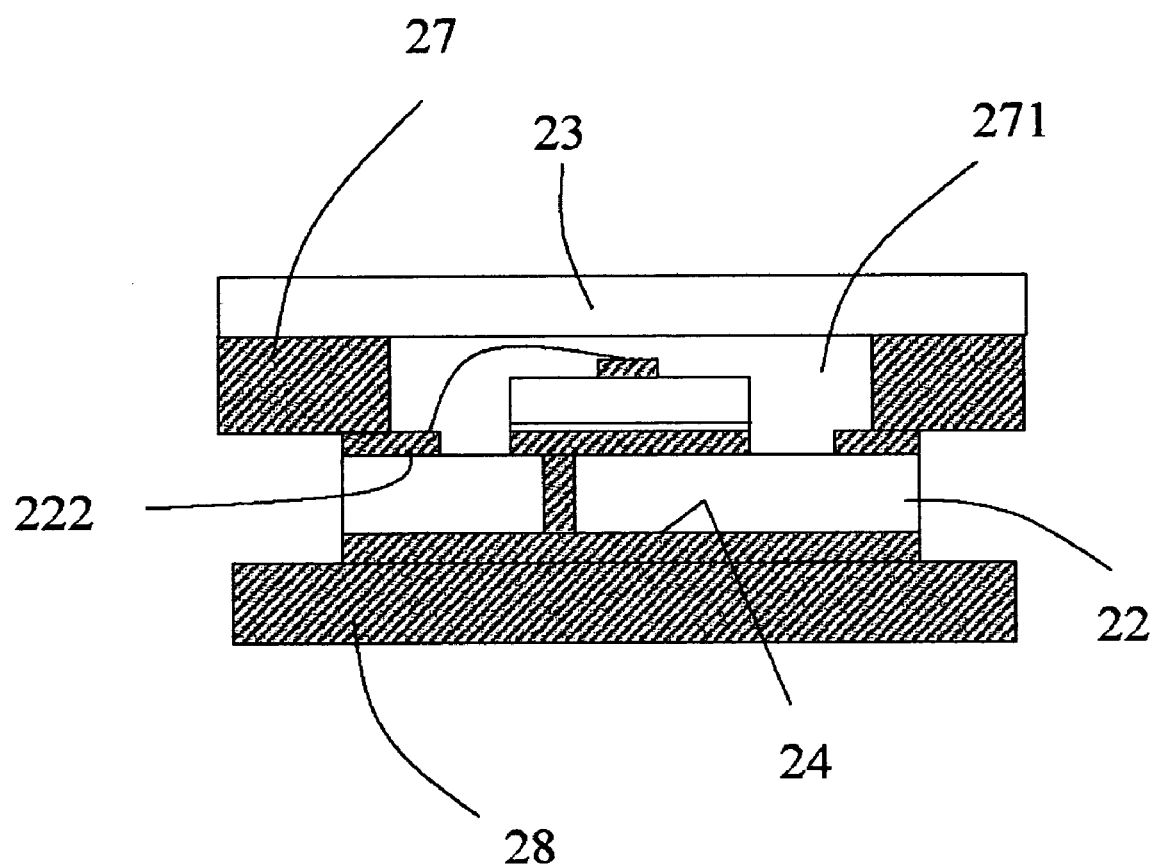
FIG. 16 shows the thirteenth embodiment of the present invention with transparent window for the structure in FIG. 14.

FIG. 16 shows the thirteenth embodiment of the present invention. In the addition to the structure shown in FIG. 15, a transparent window 23 is used to cover the top of the through-hole 271 in the top metal sheet 27 to improve the reliability.

Figure 17:
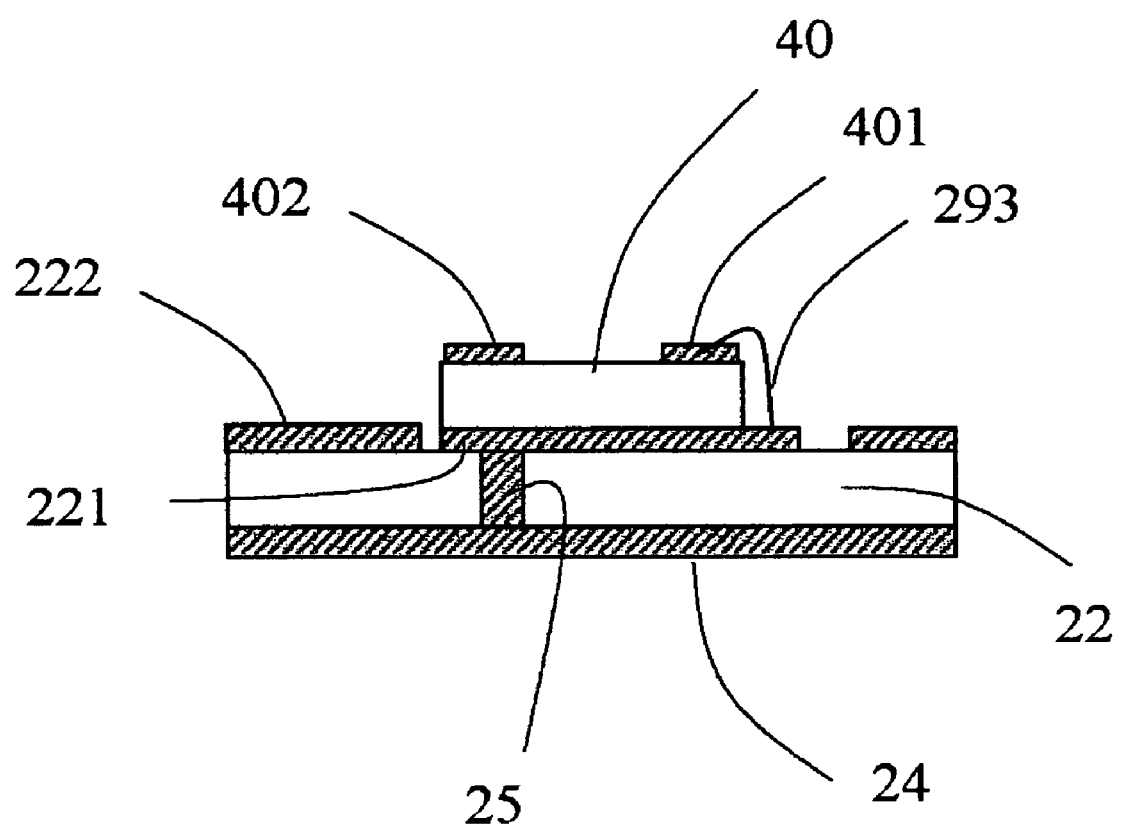
FIG. 17 shows the fourteenth embodiment of the submount of the present invention with two top diode electrodes.

FIG. 17 shows the fourteenth embodiment of the present invention. A diode chip is mounted on the submount is similar to that shown in FIG. 14, except that the diode chip 40 has two top electrodes 401, 402. The upper surface of the submount has at least one section of printed circuit area 221, which can be wire-bonded to the electrode 401.

Figure 18:
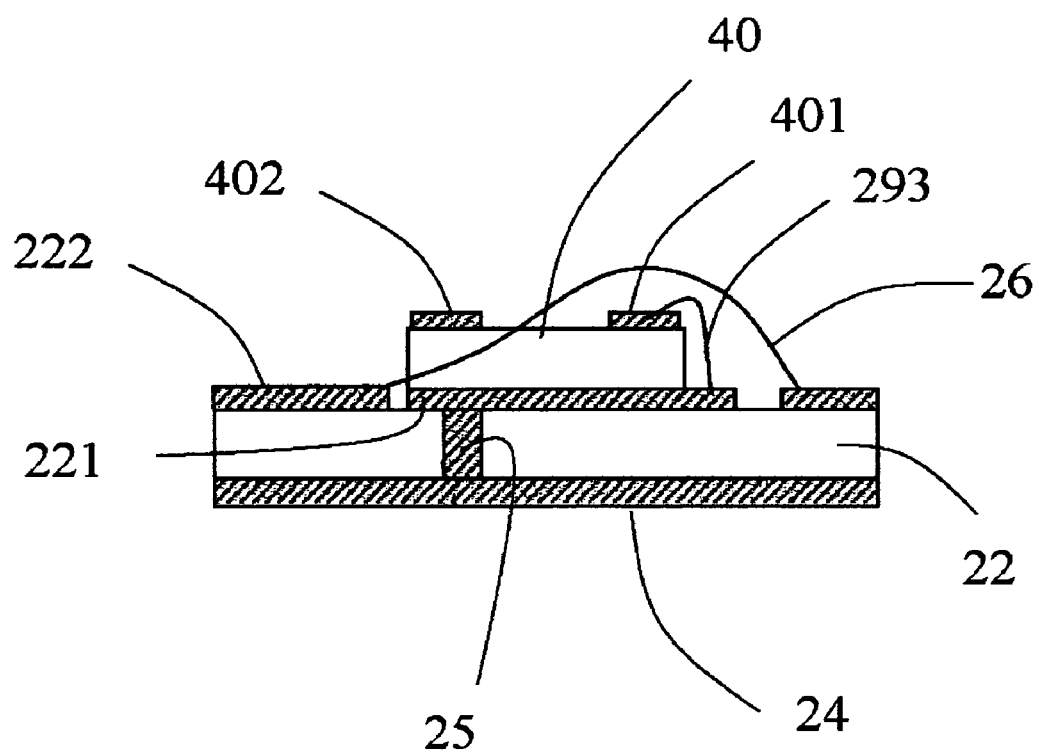
FIG. 18 shows the fifteenth embodiment of the present invention with protective glue over the structure in FIG. 17.

FIG. 18 shows the fifteenth embodiment of the present invention. In addition to the structure shown in FIG. 17, a protective glue 26 is used to seal at least the electrode 401 and the bonding wire 293.

Figure 19:
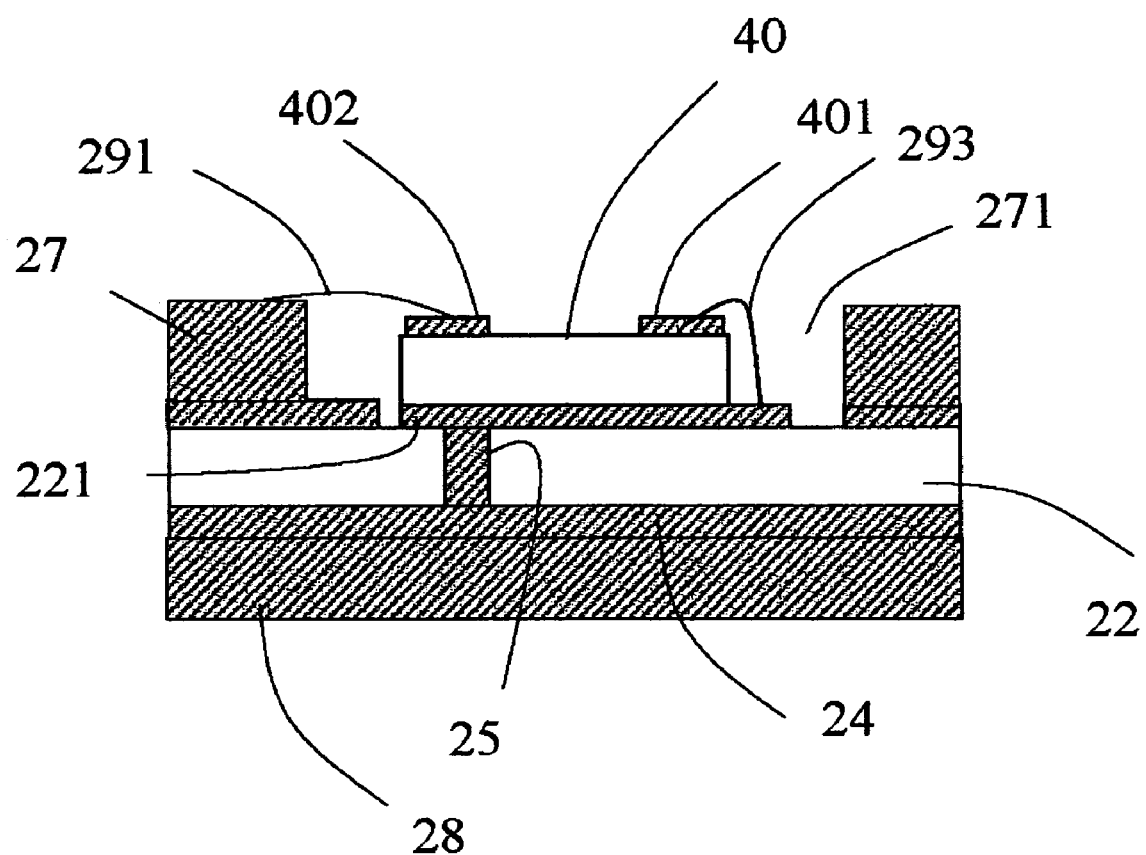
FIG. 19 shows the sixteenth embodiment of the present invention with metal sheets to clamp the submount shown in FIG. 17.

FIG. 19 shows the sixteenth embodiment of the present invention. In addition to the submount shown in FIG. 18, a top metal sheet 27 and a bottom metal sheet 28 are used to clamp the submount. The top metal sheet has a conduit 271 to anchor a chip 40 and to couple to the bottom metal sheet 28. The bottom metal sheet 28 makes contact with the lower metal plate 24 of the submount. The second electrode 402 of the diode is wire-bonded the to top metal sheet 27 through wire 291.

Figure 20:
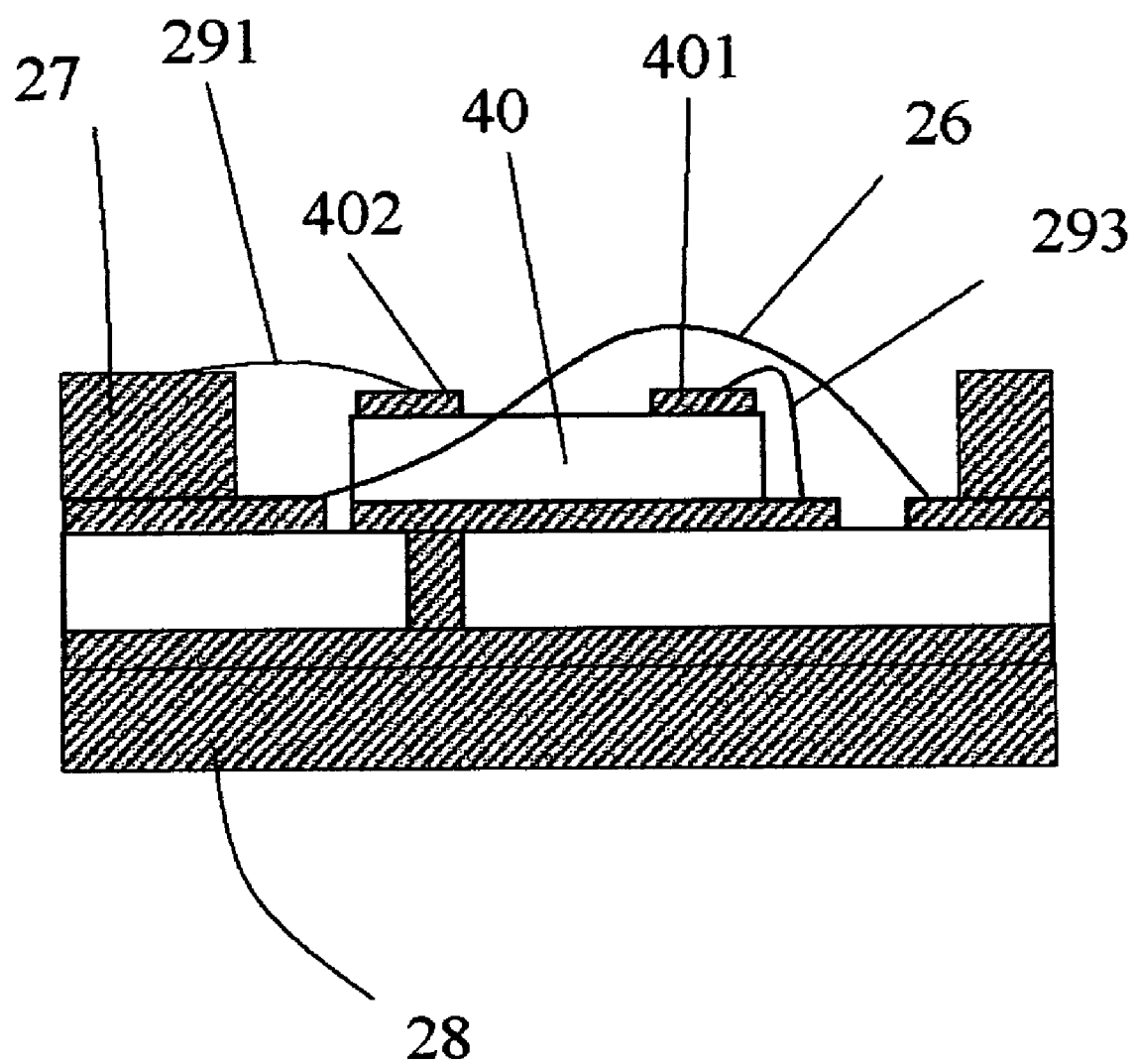
FIG. 20 shows the seventeenth embodiment of the present invention with protective glue to seal the structure in FIG. 19.

FIG. 20 shows the seventeenth embodiment of the present invention. In addition to the structure shown in FIG. 19, a protective glue 26 is used to seal at least the first electrode 401 and the bonding wire 293.

Figure 21:
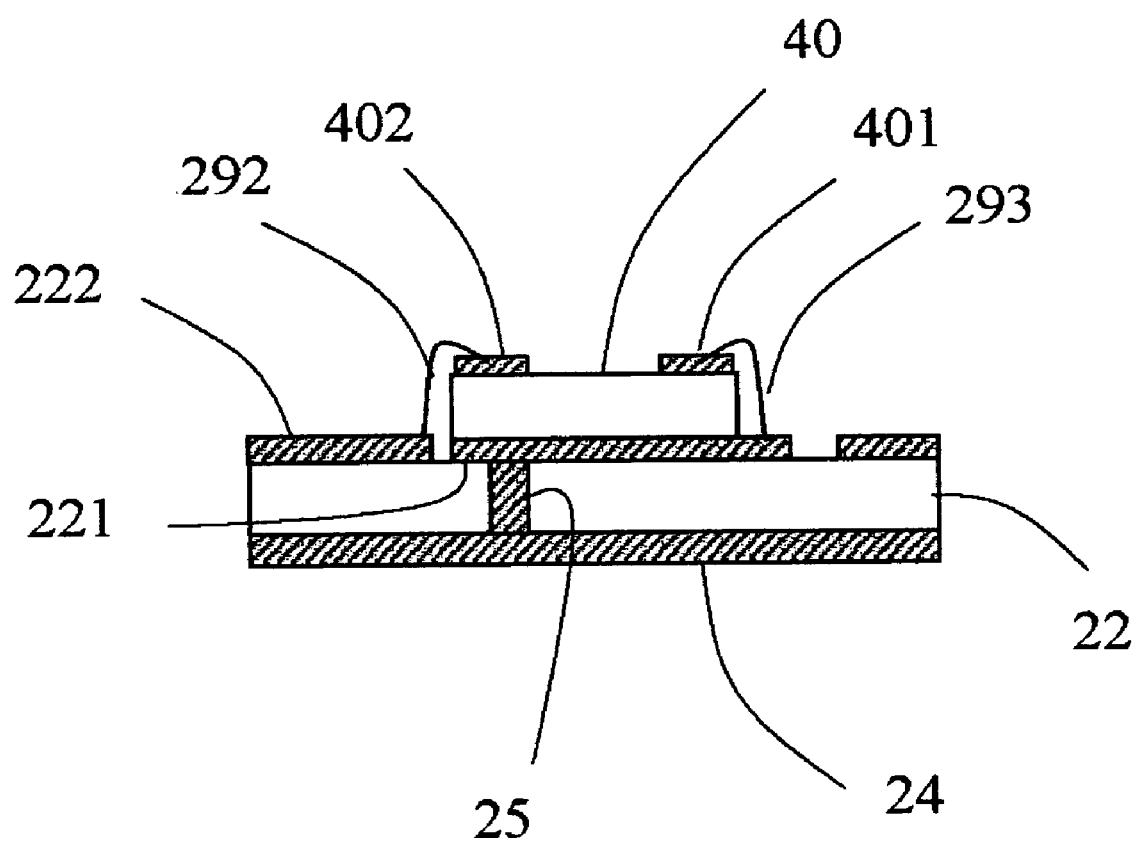
FIG. 21 shows the eighteenth embodiment of the submount of the present invention for a diode with two top electrodes.

FIG. 21 shows the eighteenth embodiment of the present invention. The submount structure is similar to that in FIG. 17, except that the diode chip has two top electrodes. Here, one top electrode 402 is wire-bonded with wire 292 to the printed wiring 222 on the top metal area of the submount. Another electrode 401 is wire bonded to the top metal area 221.

Figure 22:
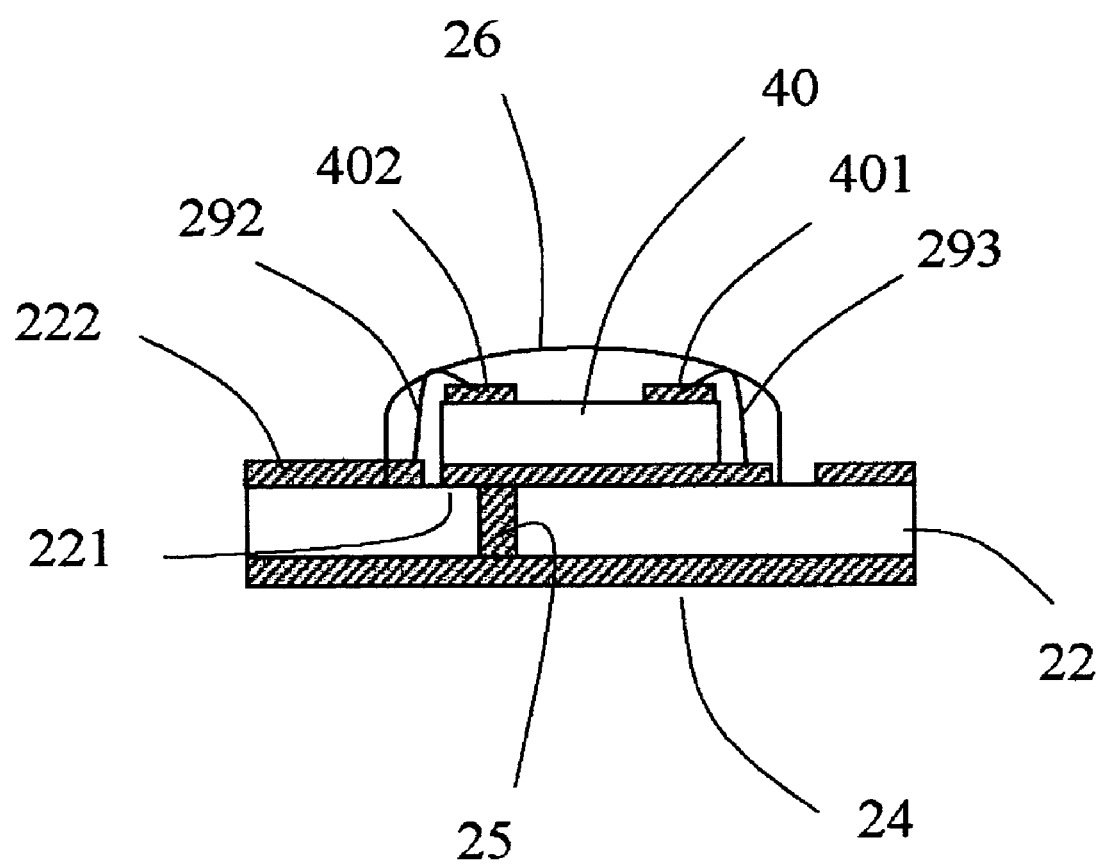
FIG. 22 shows the nineteenth embodiment of the present invention with protective glue covering the structure in FIG. 21.

FIG. 22 shows the nineteenth embodiment of the present invention. In addition to the submount structure shown in FIG. 21, a protective glue 26 is used to seal the two electrodes 401,402, the diode chip 40 and the two bonding wires 292, 293.

Figure 23:
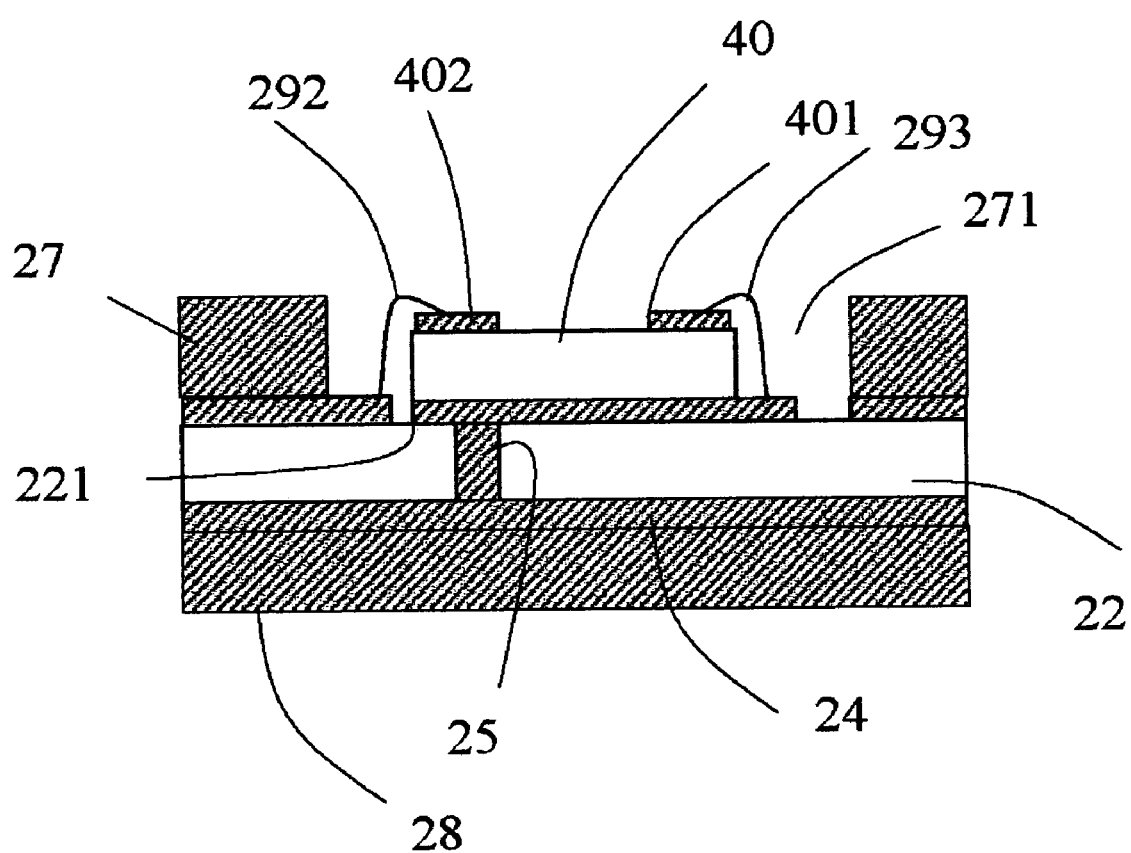
FIG. 23 shows the twentieth embodiment of the present invention with metal sheets to clamp the submount shown in FIG. 21.

FIG. 23 shows the twentieth embodiment of the present invention. In addition to the submount structure shown in FIG. 21, two metal sheets 27, 28 are used to clamp the submount. The top metal sheet 27 has a through-hole 271 to anchor the diode chip 40 and is electrically coupled to the top electrode 402. The bottom metal sheet 28 is placed below and in contact with the metal surface 24 of the submount.

Figure 24:
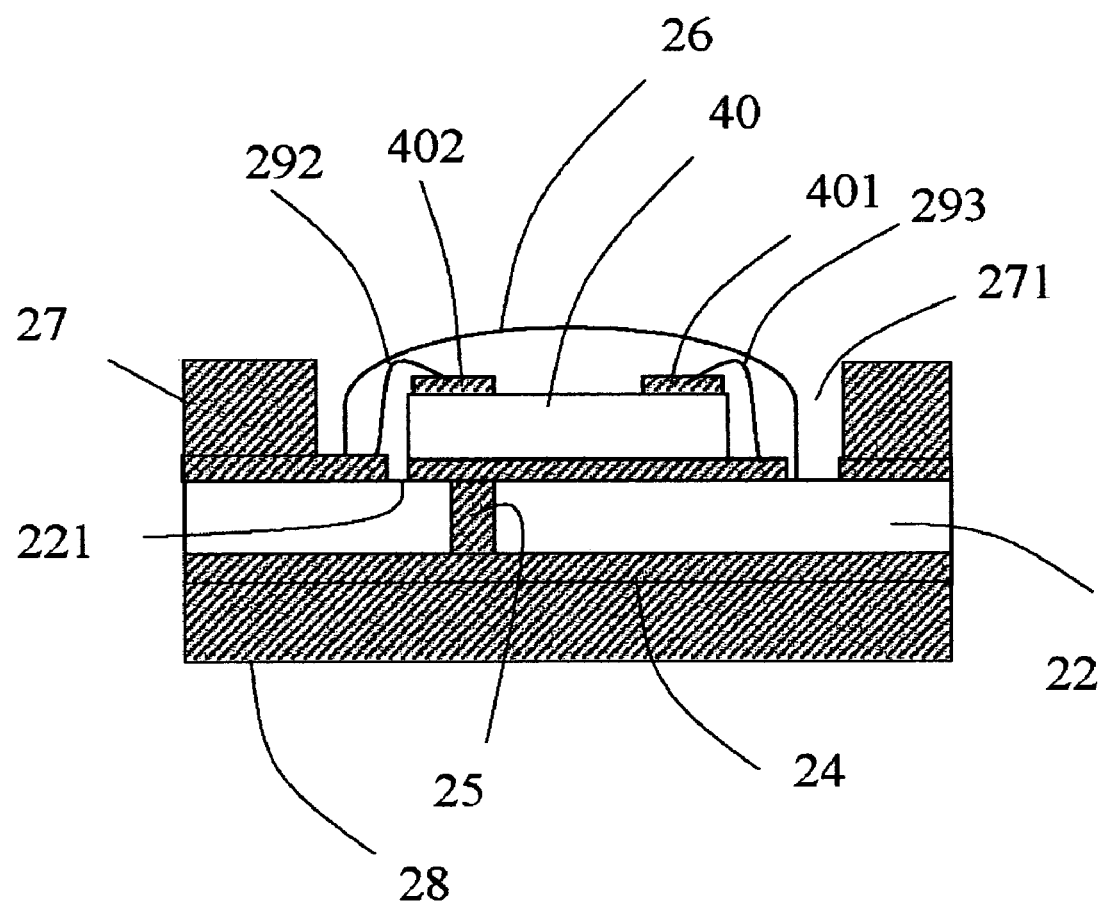
FIG. 24 shows the twenty-first embodiment of the present invention with metal sheets to clamp the submount in FIG. 22.

FIG. 24 shows the twenty-first embodiment of the present invention. In addition to the structure shown in FIG. 23, a protective glue 26 is used to seal the two electrodes 401,402, and the bonding wires 292, 293.

Figure 25:
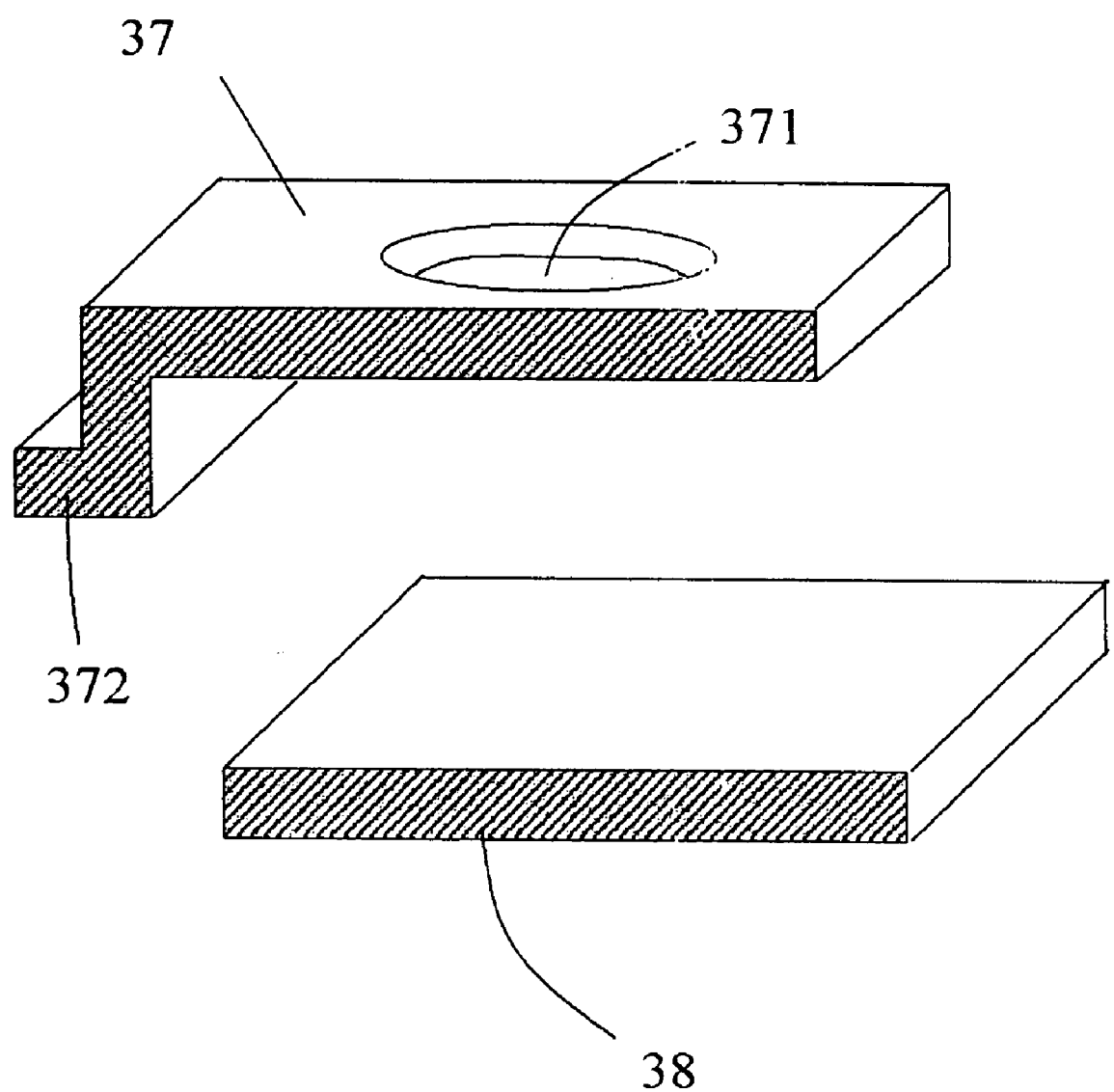
FIG. 25 shows the twenty-second embodiment of the present invention where the upper metal sheet is zigzag.

FIG. 25 shows the twenty-second embodiment of the present invention. In the forgoing embodiments where a clamping metal is incorporated such as those in FIGS. 7, 8, 11, 12, 13,16, 19, 20, 23 and 24, the top metal sheet 37 can be of zigzag shape, so that the lower part of the metal sheet 37 is planarized with that the bottom metal sheet 38 of the clamp.

Figure 26:
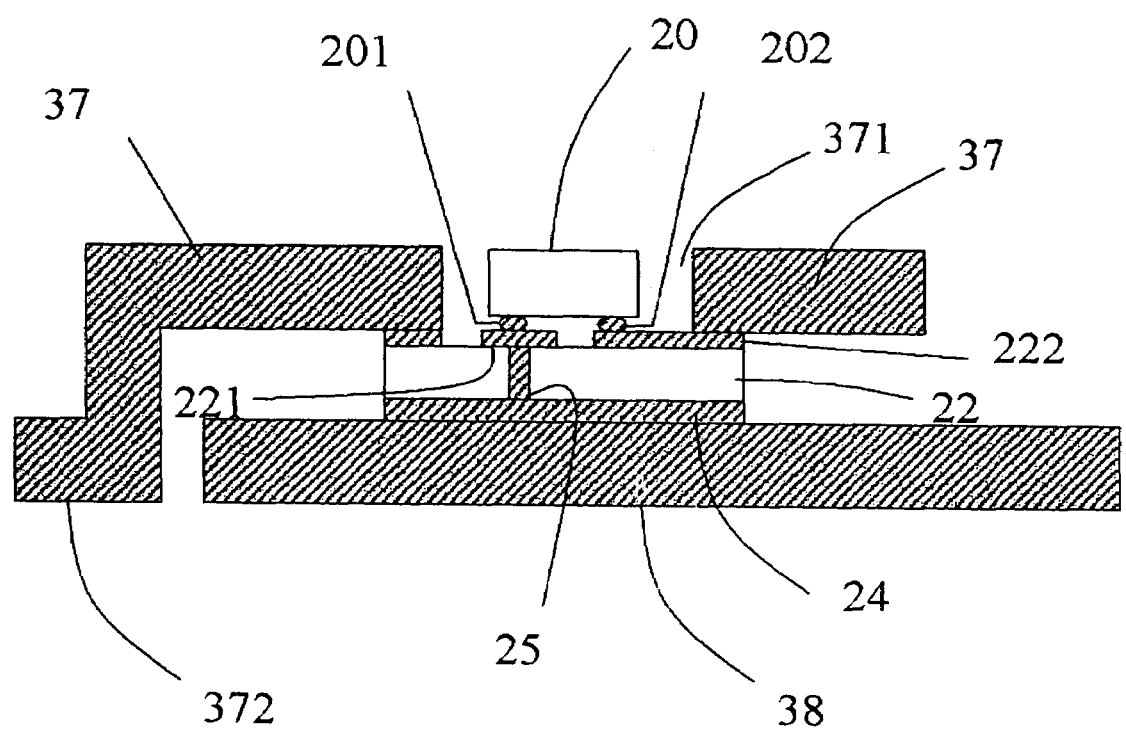
FIG. 26 shows the twenty-third embodiment of the present invention using the clamp in FIG. 25 in conjunction with a submount shown in FIG. 2.

FIG. 26 shows the twenty-third embodiment of the present invention. The figure shows how the zigzag top metal sheet 37 and the bottom metal sheet 38 clamp the submount. The zigzag metal sheet has a through-hole 371 to anchor the diode chip 20. The two clamping metal sheets are each coupled to the two electrodes of the diode electrodes without individual soldering. The submount in this figure is similar to that shown in FIG. 7. These planarized bottom surface can be painted with solder and be batch soldered upon subsequent heating.

While the preferred embodiments of the invention have been described, it will be apparent to those skilled in the art that various modifications may be made without departing from the spirit of the present invention. Such modifications are all within the scope of the present invention.

The invention claimed is:

1. A submount for a diode, comprising:
   a substrate;
   a first upper metal area on the top surface of said substrate;
   a second upper metal area on the top surface of said substrate encircling the first upper metal;
   a lower metal layer on the bottom surface of said substrate to form a single bottom electrode;
   an electrically conducting conduit coupling said first upper metal area with said lower metal layer; and
   a diode chip having a first electrode and a second electrode electrically coupled respectively to said first upper metal area and said second upper metal area to form a sub-package having said single bottom electrode.

2. The submount as described in claim 1, wherein said conduit is located near the center of the substrate vertically.

3. The submount as described in claim 1, wherein said first electrode and said second electrode are located at the bottom of said diode.

* * * * *